(12) United States Patent
Zhou

(10) Patent No.: US 8,111,105 B1
(45) Date of Patent: Feb. 7, 2012

(54) VARIABLE GAIN BICMOS AMPLIFIER

(75) Inventor: Jun Zhou, Hong Kong (HK)

(73) Assignee: Hong Kong Applied Science and Technology Research Institute Company Limited, New Territories (HK)

( * ) Notice: Subject to any disclaimer, the term of this patent is extended or adjusted under 35 U.S.C. 154(b) by 44 days.

(21) Appl. No.: 12/855,719

(22) Filed: Aug. 13, 2010

(51) Int. Cl.
  *H03F 3/16* (2006.01)
(52) U.S. Cl. ........... 330/300; 330/51; 330/302; 330/311
(58) Field of Classification Search ............... 330/51, 330/124 R, 277, 279, 283, 295, 300, 302, 330/311
  See application file for complete search history.

(56) References Cited

U.S. PATENT DOCUMENTS

| | | | |
|---|---|---|---|
| 6,046,690 A | 4/2000 | Evans | |
| 6,472,936 B1 | 10/2002 | Jones | |
| 6,586,993 B2 | 7/2003 | Macedo | |
| 6,639,468 B2 | 10/2003 | Belot | |
| 6,744,322 B1 * | 6/2004 | Ma et al. | 330/300 |
| 6,819,179 B2 | 11/2004 | Raja | |
| 6,930,546 B2 | 8/2005 | Floyd | |
| 6,977,552 B2 | 12/2005 | Macedo | |
| 7,019,593 B2 | 3/2006 | Krishnasamy Maniam et al. | |
| 7,054,605 B1 | 5/2006 | Groe | |
| 7,120,411 B2 | 10/2006 | Darabi | |
| 7,403,071 B2 | 7/2008 | Hollenbeck | |
| 7,821,334 B2 * | 10/2010 | Maeda et al. | 330/51 |
| 2005/0068099 A1 | 3/2005 | Floyd | |
| 2005/0134373 A1 * | 6/2005 | Chen et al. | 330/51 |
| 2011/0018635 A1 * | 1/2011 | Tasic et al. | 330/277 |

OTHER PUBLICATIONS

Changjoon Park, Huijung Kim, Jong-Ryul Lee, and Bumman Kim, "Dual mode Low Noise Amplifier for WCDMA Applications," International SoC Design Conference, Seoul, Korea, pp. 184-187, Oct. 25-26, 2004.
M. Koutani, H. Kawamura, S. Toyoyama, and K. Iizuka, "A Digitally Controlled Variable-gain Low-noise Amplifier with Strong Immunity to Interferers", IEEE Journal of Solid-State Circuits, vol. 42, pp. 2395-2403, Nov. 2007.
Xuezhen Wang; Han-Chi Hsieh; Dubash, N.; Zanfino, G.; Mendoza, A.; Schucker, D.; "A novel simultaneous input and output matching method for GPS CMOS switched Low Noise Amplifier"; 50th IEEE International Midwest Symposium on Circuits and Systems, MWSCAS 2007, Aug. 5-8, 2007 pp. 423-426.
Yuuichi Aoki, Nobuyuki Hayama, Masahiro Fujii, and Hikaru Hida, 24th Annual Technical Digest on Gallium Arsenide Integrated Circuit (GaAs IC) Symposium, Nov. 2002, pp. 197-200.

* cited by examiner

*Primary Examiner* — Khanh Nguyen
(74) *Attorney, Agent, or Firm* — Ella Cheong Hong Kong; Margaret A. Burke; Sam T. Yip

(57) ABSTRACT

An amplifier circuit comprising: a MOSFET amplifier circuit; a BJT amplifier circuit; a MOSFET switch circuit arranged for switching between the MOSFET amplifier circuit and the BJT amplifier circuit to implement different gain modes of the amplifier circuit.

13 Claims, 3 Drawing Sheets

| Para-meter | High-Gain | Middle-Gain | Low-Gain | Effective Performance |
|---|---|---|---|---|
| Gain | 14dB | -2dB | -18dB | 14->-18dB |
| Return Loss | >12dB | >12dB | >12dB | >12dB |
| Noise Figure | 2.2dB | 9.4dB | 18.8dB | 2.2dB |
| 1dB Compression | -9dBm | -6dBm | 7dBm | 7dBm |
| IIP3 | -1dBm | 2dBm | 17dBm | 17dBm |
| S12 | >40dB | >40dB | >40dB | >40dB |
| Freq. Selectivity | Good | Good | Good | Good |

Figure 3

VARIABLE GAIN BICMOS AMPLIFIER

FIELD OF INVENTION

The present invention relates broadly to a variable gain BiCMOS amplifier. More particularly, the present invention relates to a variable gain low noise BiCMOS amplifier.

BACKGROUND

A variable gain BiCMOS LNA (low noise amplifier) allows the linearity of the LNA to be sacrificed for higher sensitivity, and the sensitivity of the LNA to be sacrificed for higher linearity. For example, in the case where a higher gain for a low input signal is required, the sensitivity of the LNA is increased at the expense of the linearity by switching to BJT amplifier selectively. Conversely, in the case where a lower gain for a high input signal is required, linearity of the LNA is increased at the expense of sensitivity by switching to apply MOSFET amplifier selectively.

Attempts have also been made to achieve variable gain BiCMOS LNAs. U.S. Pat. No. 7,054,605, U.S. Pat. No. 6,977,552, U.S. Pat. No. 6,930,546, U.S. Pat. No. 6,586,993, US20050068099 disclose attempts to provide variable gain through the use of a bypassing switch. In these disclosures, either BJT (Bipolar Junction Transistor) or MOS (Metal-Oxide-Semiconductor) transistors are used to build low noise and high gain amplifiers. MOS transistors are used to build the bypass switching circuit. However, such designs suffer from various shortcomings. These circuits are complex in design, particularly when the input and output impedances have to be kept unchanged when switching the gain mode. Further, the variability is limited as only 2 gain modes are provided, e.g. a high gain mode and a low gain mode. The reverse isolation is also insufficient to minimize LO (local oscillation) leakage into the antenna at low-gain mode or bypass mode. Additionally, in the low-gain (bypass) mode, frequency selectivity is not available and the gain level is not easily controlled in circuit design.

U.S. Pat. No. 6,046,640, U.S. Pat. No. 6,472,936, U.S. Pat. No. 6,639,468, U.S. Pat. No. 6,819,179 and U.S. Pat. No. 7,019,593 disclose the provision of the variable gain through an output loading switch in conjunction with BJT or MOS LNAs. These solutions may provide consistent input match and good inverse isolation. However, there exist difficulties in keeping the output impedance and frequency response of these circuits unchanged during the switching of gain modes.

U.S. Pat. No. 7,403,071 discloses a LNA design which provides variable gain through an Input Attenuation Switch. While the circuit design is relatively simple and overcomes all shortcomings from above, it suffers from reduced sensitivity at high gain mode because of the 2-port input attenuation network.

The use of a capacitor network as an attenuator has also been disclosed. For example, *A digital controlled Variable-Gain Low-Noise Amplifier with Strong Immunity to Interferers* using 0.5 um SiGe BiCMOS has been disclosed in *IEEE Journal of Solid-State Circuits*, Vol. 42, Issue 11, November 2007, by Sharp Corporation, Japan. The circuit, however, does not show consistent frequency selectivity and good S11 at all gain modes.

A *Dual Mode Low Noise Amplifier for WCDMA applications* using 0.35 um SiGe BiCMOS was disclosed in the International SoC Design Conference 2004 by the Department of EEE, POSTECH, Pohang Korea which also illustrate the use of a MOS amplifier as an attenuator. The circuit however does not show frequency selectivity and cannot provide enough LO leakage isolation to the RF antenna in the bypass mode. Further, it is a single-ended circuit and is easily affected by various interference signals.

SiRF Technology, Inc, US disclosed a *Novel Simultaneous Input and Output Matching Method for GPS CMOS Switched Low Noise Amplifier* using 0.18 um SiGe BiCMOS—$50^{th}$ IEEE International Midwest Symposium on Circuits and Systems, MWSCAS 2007, 5-8 Aug. 2007, Page(s): 423-426, while NEC Corporation, Japan discloses a 23/3 *dB Dual Gain LNA for 5-GHz Band Wireless Applications (InGaP/GaAs HBT)* in $24^{th}$ Annual Technical Digest on Gallium Arsenide Integrated Circuit (GaAs IC) Symposium, 2002, Page(s): 197-200. Both circuits illustrate the use of MOS amplifiers as an attenuator but are however, complicated and may therefore be susceptible to processing related failures. Additionally, the input and output terminals are not isolated from each other and therefore, simultaneous input and output impedance adjustments are required. Further, attenuation produced by the circuit is limited.

U.S. Pat. No. 7,120,411 discloses a MOS LNA design which provides variable gain by allowing adjustments to the DC current passing LC tank, settles input/output impedance matching, signal frequency response and reverse isolation at all gain steps simultaneously. However, the design is limited to a pure CMOS LNA design and is not suitable for use with a BiCMOS LNA as it is difficult to isolate the Bipolar amplifier circuit block from the CMOS amplifier circuit block, and to keep return loss S11 minimum during switching between the Bipolar amplifier and the CMOS amplifier.

Therefore, there exists a need to provide a system and method for a variable gain BiCMOS Amplifier to address all problems in input/output impedance matching, frequency selectivity, and sufficient reverse isolation at all gain steps as mentioned above and solving all the problems simultaneously.

SUMMARY

In accordance with a first aspect of the present invention, there is provided an amplifier circuit comprising: a MOSFET amplifier circuit; a BJT amplifier circuit; a MOSFET switch circuit arranged for switching between the MOSFET amplifier circuit and the BJT amplifier circuit to implement different gain modes of the amplifier circuit. The low gain mode may be provided by the selection of the MOSFET amplifier circuit. The middle and high gain modes may be provided by the selection of the BJT amplifier circuit.

The BJT amplifier circuit may further comprise a BJT switch circuit arranged for switching between one or more BJT transistors with different sizes to implement different gain modes of the BJT amplifier circuit and thus the amplifier circuit.

The BJT amplifier circuit may further comprise a DC biasing circuit for providing the one or more DC biasing voltages at high and middle gain steps.

The biasing circuit may comprise one or more selectable voltage dividers.

The variable gain modes may include a low gain mode, a middle gain mode and a high gain mode as shown in FIG. 1. The variable gain mode may also include multiple low gain modes with more than one gain step, multiple high/middle gain modes with more than 2 gain steps. Multiple low gain modes can be realized based on the method as described in the U.S. Pat. No. 7,120,411, which is hereby incorporated by reference in its entirety, while the multiple high/middle modes can be realized by a similar way described here through providing 3 or more biasing resistor dividers and switchable BJT transistors.

The low gain mode may be provided by the selection of the MOSFET amplifier circuit.

The middle and high gain modes may be provided by the selection of the BJT amplifier circuit.

The amplifier circuit may further comprise an inductor operatively coupled to the MOSFET switch circuit for providing shared matching with the real portion of input impedance between the MOSFET amplifier circuit and the BJT amplifier circuit.

The amplifier circuit may further comprise an external matching network operatively coupled to the amplifier circuit for providing matching with the imaginary portion of input impedance when the BJT amplifier circuit is selected.

The amplifier circuit may further comprise a capacitor bank arranged for matching with the imaginary portion of input impedance when the MOSFET amplifier circuit is selected.

The capacitor bank may comprise one or more selectable capacitors.

The amplifier circuit may further comprise an LC tank coupled to an output of the amplifier circuit, said LC tank for providing shared output impedance control and selective frequency response between the amplifier circuit and the BJT amplifier circuit.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 3 is a table illustrating various parameters obtained from the three gain modes.

DETAILED DESCRIPTION

Figure 1:
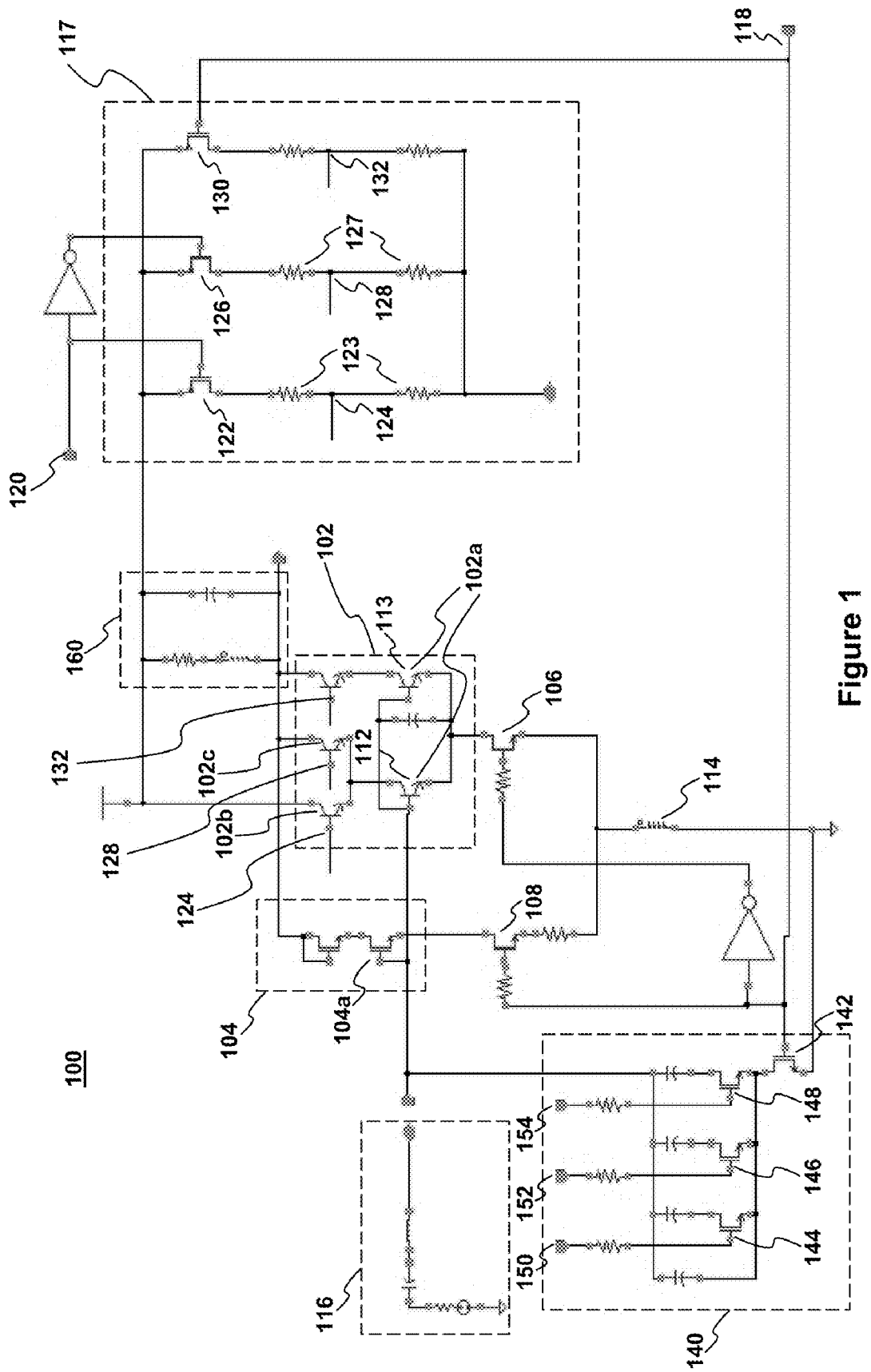
FIG. 1 is a block diagram of a single-ended variable gain LNA in an example embodiment.

FIG. 1 shows a single-ended variable gain LNA 100 in an example embodiment. In the example embodiment, a BJT cascode amplifier 102 and a MOS (MOSFET) cascode amplifier 104 are combined together to build the LNA 100. The BJT cascode amplifier 102 is used at High/Middle gains as it can provide higher gain and better noise figure. The MOS cascode amplifier 104 is used at low gain as it can provide better linearity.

In the example embodiment, two input signals, L_Gain 118 and H_Gain 120 allow for the selection between the three defined modes, namely the High Gain mode, the Middle Gain mode and the Low gain mode. A brief description of the selection of the three modes is as follows:

In order to select between the high/middle and low gain modes (i.e. between the BJT cascode amplifier 102 used at High/Middle gain modes or the MOS cascode amplifier 104 are used at the low gain mode), a MOS switch 106 at the emitter node of the input BJT transistor(s) 102a of the BJT cascode amplifier 102 and a MOS switch 108 at the source node of the input transistor 104a of MOS cascode amplifier 104 are used. In other words, the MOS switches 106, 108 allow the LNA to be selectable as a BJT amplifier or a MOS amplifier.

After the High/Middle gain mode has been selected via the MOS switch 106, a DC biasing circuit 117 is used to switch between the high and middle gain modes. The DC biasing circuit 117, based on the selected mode, determines the DC biasing voltage for the BJT transistors 102b and 102c to be on or off. If the BJT transistor 102c is on and the BJT transistor 102b is off, the left portion 112 of the input BJT transistor(s) 102a will be connected to the LC tank 160. If the BJT transistor 102b is on and the BJT transistor 102c is off, the left portion 112 of the input BJT transistor(s) 102a will be disconnected from the LC tank 160, and contribute nothing to the signal within LC tank 160. As sizes of the BJT transistors 102b and 102c are exactly the same, the DC biasing of the BJT transistor 102a keep unchanged regardless whether the BJT transistor 102b is on or the BJT transistor 102c is on. In the two cases, the effective size of the input BJT transistor(s) 102a is changeable for the signal within the LC tank 160, which functions as a bandpass filter, as the total size of the input BJT transistor(s) 102a is made up of the left portion 112 (the BJT transistor on the left) and the right portion 113 (the BJT transistor on the right), and the BJT transistor 112 may or may not amplify the signal as the BJT transistors 102b and 102c can be on or off.

Turning-on or off the PMOS switch transistors 122, 126 by full-swing logic signal may switch the BJT cascode amplifier 102 between 2 different gains, e.g. the middle gain mode or the high gain mode.

An active L_Gain 118 ("1") triggers the selection of the Low Gain mode. The active L_Gain 118 activates switch 108 to select the MOS cascode amplifier 104. The active L_Gain 118 also activates HM_DC_Bias 132 via switch 130 such that DC biasing is provided for the Low Gain mode.

An inactive L_Gain 118, e.g. ("0") coupled with an active H_Gain 120 ("1"), triggers the selection of the High Gain mode. The inactive L_Gain 118 activates switch 106 to select the BJT cascode amplifier 102, while the active H_Gain 120 activates switch 122 to pull DC node H_DC_Bias 124 high to activate switch 102b, and to provide a constant biasing voltage for the BJT cascode amplifier 102.

The Middle Gain mode is triggered by an inactive L_Gain 118 ("0") and an inactive H_Gain 120 ("0"). The inactive L_Gain 118 activates switch 106 to select the BJT cascode amplifier 102, while the inactive H_Gain 120 activates switch 126 to pull high DC mode M_DC_Bias 128 to activate switch 102c, and to provide the same biasing voltage for the BJT cascode amplifier 102.

As illustrated in FIG. 1, two resistor voltage dividers with good RF isolation 123, 127 bias the common-base BJT transistors 102b, 102c in the BJT cascode amplifier 102. That is, one BJT transistor 102b or 102c is turned on at any time to work with BJT transistor 102a.

A source or emitter degeneration inductor 114, and an external matching network 116 can each be shared among both the BJT cascode amplifier 102 and MOS cascode amplifier 104 for all gain modes.

Either cascode amplifiers 102 or 104 may provide good reverse isolation between the input circuit network and output circuit network.

Figure 2:
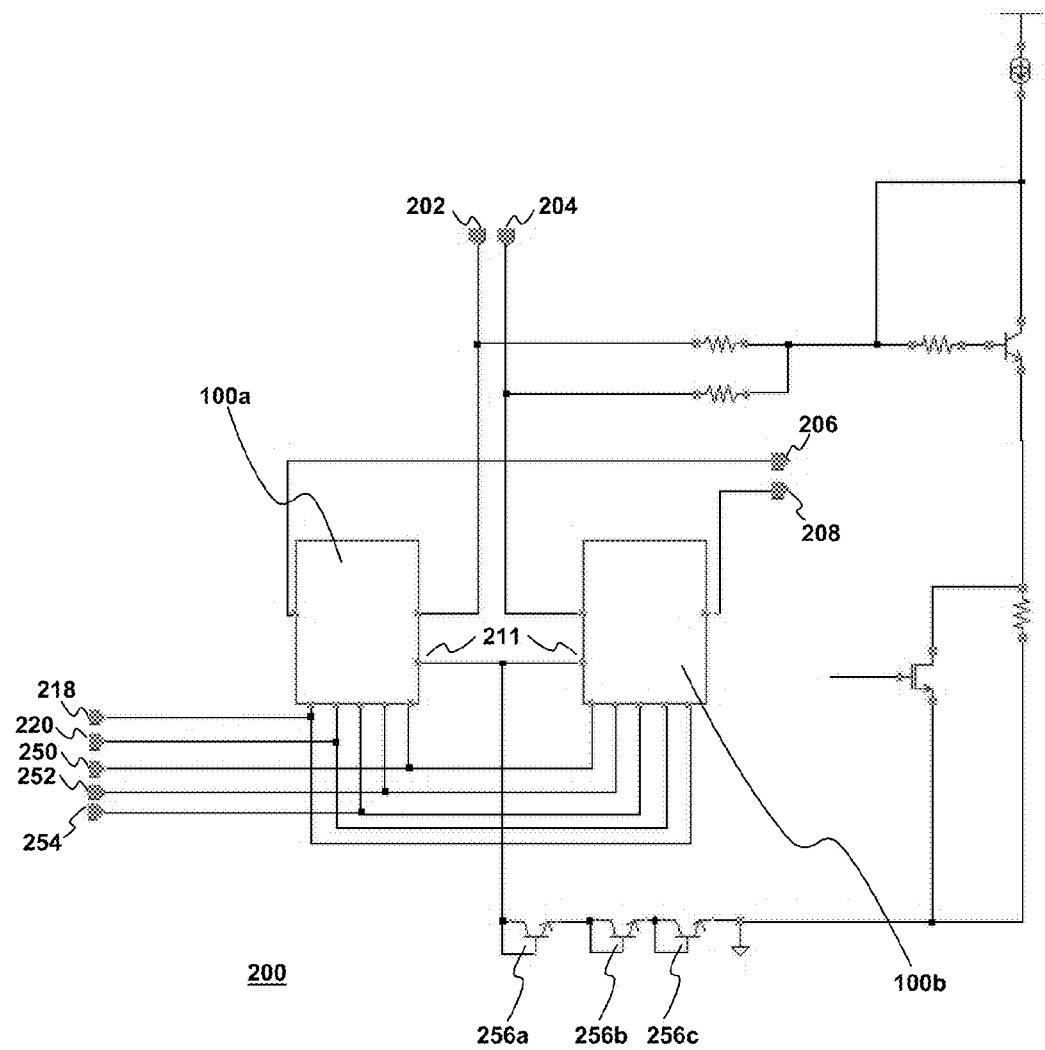
FIG. 2 is a block diagram of a pseudo-differential SiGe BiCMOS LNA implemented using two single-ended LNA in an example embodiment.

Size of the degeneration inductor 114 is optimized together with BJT cascode amplifier to realize any specific real portion of single-ended or differential input impedance, such as 50 Ohm, 100 Ohm, 75 Ohm, 150 Ohm, etc. Size of external inductor and capacitor as shown in FIG. 2, is selected to be resonant with input capacitance or imaginary portion of input impedance of LNA to obtain minimal return-loss (S11) at high or middle gain mode.

When the LNA is working as a MOSFET cascode or low-gain amplifier, the sizes of the switch transistors 144, 146, 148 are selected to realize any specific real portion of single-ended or differential input impedance, such as 50 Ohm, 100 Ohm, 75 Ohm, 150 Ohm, etc. A set of capacitors 144 which shunt along the LNA input port are selected properly, via selecting input logic signals L_Gain_Cap1 150, L_Gain_Cap2 152 and L_Gain_Cap3 154, to be resonant with external matching inductors to obtain minimal input return-loss (S11). The set of capacitors is disconnected when the BJT amplifier 102 is enabled. It is connected when the MOSFET amplifier 104 is enabled via the L_Gain signal 118 which triggers the switch 142.

The MOSFET amplifier 104 (FIG. 1) selected at the low gain stage in the LNA 100 (FIG. 1) can also be designed as a bypass or attenuator circuit, providing the same frequency selectivity, input/output impedance matching and high reverse isolation based on design specification and requirement.

The example embodiment is an implementation of a specifically designed circuit which can ensure that the input impedance is unchanged during switching between the three gain modes.

The design and operation of the source or emitter degeneration inductor 114, and the external matching network 116 are understood by a person skilled in the art and are therefore not described in detail.

A LC tank 160 can be provided as illustrated in FIG. 1 that dominates frequency selectivity and output impedance of the LNA 100. Therefore, the output impedance and selective frequency response of the LNA 100 can be kept unchanged when the LNA 100 switches among the three gain modes. As another embodiment, capacitor in the LC tank can be used to adjust peak frequency of the LC tank 160. As a common output for the MOSFET amplifier 104 and the BJT amplifier 102, the LC tank 160 functions as a loading for both the MOSFET amplifier 104 and the BJT amplifier 102. For signal transmitting through the LC tank 160, the LC tank 160 functions as a bandpass filter.

In the present invention, the input matching network and output matching network are isolated from each other with less interaction because of good input/output isolation from cascode amplifier. Both matching networks can be designed independently and simply. Further, the high-gain/middle-gain bipolar amplifier and the low-gain CMOS amplifier are also isolated from each other with less interaction because only one amplifier is enabled at any one time. Each amplifier can also be designed independently and simply.

The basic variable gain BiCMOS low noise amplifier 100 can be used to build single-ended, differential and pseudo-differential variable gain BiCMOS low noise amplifier.

FIG. 2 shows an example embodiment of a pseudo-differential SiGe BiCMOS LNA 200 implemented using two single-ended LNA 100a, 100b and an added DC biasing circuit Differential input signals RF_In_P 202 and RF_In_N 204 are fed into respective LNA 100a and 100b. L_Gain 218, H_Gain 220 allow the selection among the high, middle and low gain modes. L_Gain_Cap1 250, L_Gain_Cap2 252 and L_Gain_Cap3 254 signals allow for input impedance matching of the LNA 200 at low gain. Differential output signals RF_Out_P 206 and RF_Out_N 208 are then generated by the LNA 200. Diode-connected BJT transistors 256a, 256b and 256c provide a voltage drop at node 211. DC biasing circuitry in FIG. 2 provides desired DC biasing voltage at nodes 202 and 204 to the respective LNA 100a and 100b at emitter node for BJT block (102 of FIG. 1) and at gate for CMOS Block (104 of FIG. 1) as shown in FIG. 2. When NMOS switch in FIG. 2 is on and low gain mode is selected, lower DC biasing is supplied to MOS amplifier. When NMOS switch in FIG. 2 is off and high/middle gain mode is selected, higher DC biasing is supplied to BJT amplifier at high/middle gain modes.

Diode-connected BJT transistors are used in the example embodiments to provide a constant voltage drop. This may provide the advantage of taking up less space on the die, when compared with using resistors instead. Only one set of diode-connected BJT transistors is shared between the two mirror-symmetric single-ended BJT cascode amplifiers.

An example embodiment of the pseudo-differential variable gain SiGe BiCMOS LNA 200 is evaluated with the following design parameters:
Operating Frequency: 1 GHz with relative bandwidth 15%
Process Technology: 0.35 um SiGe BiCMOS
DC Voltage Supply: 3.0 V The example embodiment may be applied in wireline communications or short distance wireless communication, as very large input signals can be expected or a large 1 dB compression point may be required while long distance communications or very high receiving sensitivity is demanded simultaneously.

In the example embodiments of the present invention, multiple gain steps in the LNA can also be applied to decrease the dynamic range requirement for the next stage of the RF block, which can be e.g. an active mixer, that is a next stage for which a high input dynamic range is difficult to achieve.

Compared to pure BJT with Bypass or pure BJT with attenuator circuit topologies, the example embodiments of the present invention can provide frequency selectivity and constant output impedance at all gain steps. Without additional LC tanks, BJT with Bypass or BJT with Attenuator circuit topologies may only provide constant frequency response and hence cannot allow for frequency selectivity.

In one non-limiting embodiment with results depicted as in FIG. 3, the differential BiCMOS amplifier 200 works as either an amplifier or attenuator when the LNA 200 is in various gain modes. The bipolar amplifier 200 provides a high gain (for example, 14 dB) when the LNA 200 is in the high gain mode. The bipolar amplifier 200 provides a middle gain (for example, −2 dB) when the LNA 200 is in the middle gain mode. The BiCMOS amplifier 200 provides a low gain (for example, −18 dB) when the LNA 200 in the low gain mode. In this embodiment, the BiCMOS amplifier 200 provides a range of gains with different magnitudes (for example, from 14 dB to −18 dB) with good frequency selectivity and high reverse isolation S12 (for example, S12 is more than 40 dB) at each gain stage. The BiCMOS amplifier 200 also provides a high return loss at all gains (for example, more than 12 dB at working frequency range).

As shown in FIG. 3, the noise figure of the BiCMOS amplifier 200 is getting lower with increasing gain (e.g. from 18.8 dB to 2.2 dB). As such the BiCMOS amplifier 200 has an effective noise figure of 2.2 dB. In terms of 1 dB compression, the 1 dB compression levels of the BiCMOS amplifier 200 is higher with decreasing gain (e.g. from −9 dBm to 7 dBm). As such, the BiCMOS amplifier 200 has an effective 1 dB compression power level of 7 dBm. In terms of third-order intercept point (IIP3), the IIP3 power levels of the BiCMOS amplifier 200 is higher with decreasing gain (e.g. −1 dBm to 17 dBm). As such, the BiCMOS amplifier 200 has an effective IIP3 power level of 17 dBm.

The embodiments of the present invention seek to provide a variable gain low noise amplifier. The inventors have recognised that SiGe HBTs (Silicon-germanium heterojunction BJT transistors) can provide superior RF (Radio Frequency)

performance over CMOS transistors. In particular, the SiGe HBTs can provide higher transistor speed and gain, lower noise figure and lower current/power consumption which results in longer battery life spans. Further, SiGe can provide competitive RF performance when compared with GaAs (Gallium Arsenide) HBT and FET, while maintaining a relatively low cost.

Further, BJT and CMOS devices have been merged and fabricated on the same technological platform in the form of e.g. SiGe BiCMOS (BiPolar Junction CMOS). CMOS devices may build large digital circuits to perform complex logic functions with almost no current consumption. The inventors have recognized that these SiGe BiCMOS offer increased design flexibility as they can provide a wider range of device types.

The embodiments of the present invention can provide a LNA with both good linearity and high sensitivity catered for high input signal dynamic range, good frequency selectivity and LO leakage isolation at the same time. Further, the LNA can provide both input and output impedance matching at all gain steps.

In the example embodiments, both BJT cascode and MOS cascode amplifiers are combined together to build LNAs with Variable Gain. A MOS switch at the source node of the input transistor of the BJT cascode amplifier and MOS switch at emitter node of input transistor of MOS cascode amplifier are used to make the LNA work either as a BJT amplifier or MOS amplifier at selection. Further, a source or emitter degeneration inductor, and external matching network are shared among all gain modes. The same LC tank may also be applied for both BJT cascode and MOS cascode amplifiers.

The output impedance and frequency selectivity of the LNA in the example embodiments at any gain mode at the operating frequency is kept unchanged, regardless of gain mode.

The MOSFET amplifier in the example embodiment at the low gain stage can be designed either as an attenuator or a bypass based on design specification and requirement without introducing LO leakage or losing frequency selectivity.

In addition, the gain level can be controlled in the circuit design by varying amplifying transistor sizes of the MOSFET amplifier, when it is operating in the low gain mode.

In the example embodiments, resistor voltage dividers with good RF isolation are used to bias common-base BJT transistor in the BJT cascode amplifier. Turning-on or off the PMOS switch transistor by full-swing logic signal may switch the BJT cascode amplifier between 2 different gain modes.

In the example embodiments, the size of the degeneration inductor may be optimized together with BJT cascode amplifier to realize about 50 or 100 Ohm differential input impedance. When the LNA is working as a MOSFET cascode or low-gain amplifier, a set of capacitors which shunt along the LNA input port are selected to resonant with external matching inductors to obtain minimal input return-loss (S11). The size of the inductor is selected to ensure that the real portion of input impedance of the LNA input port is equal to the source impedance of the test port. In the example embodiment, the inductor is a spiral inductor with about 5-10 turns, and measuring e.g. 50 um×50 um to 200 um×200 um on the die.

The embodiments of the present invention can provide good performance with multiple Gain Steps (modes). With the BJT cascode amplifiers, Low NF and High Gain may be achieved while the MOSFET cascode amplifiers may achieve high linearity at Low Gain.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. An amplifier circuit comprising:
    a MOSFET amplifier circuit;
    a BJT amplifier circuit;
    a MOSFET switch circuit arranged for switching between the MOSFET amplifier circuit and the BJT amplifier circuit to implement different gain modes of the amplifier circuit;
    a LC tank coupled to the outputs of both the MOSFET amplifier circuit and the BJT amplifier circuit; and
    an external matching network operatively coupled to the input of the amplifier circuit.

2. The amplifier circuit as claimed in claim 1, wherein the BJT amplifier circuit further comprises a BJT switch circuit arranged for switching between one or more BJT transistors with variable effective size for signal within the LC tank to implement different gain modes of the BJT amplifier circuit and thus the amplifier circuit.

3. The amplifier circuit as claimed in claim 2, wherein the BJT amplifier circuit further comprises a DC biasing circuit for providing the one or more DC biasing voltages at high and middle gain steps.

4. The amplifier circuit as claimed in claim 3, wherein the biasing circuit comprises one or more selectable voltage dividers.

5. The amplifier circuit as claimed in claim 1, wherein the different gain modes comprise a low gain mode, a middle gain mode and a high gain mode.

6. The amplifier circuit as claimed in claim 5, wherein the different gain modes may also comprise multiple low gain modes with more than one gain step, multiple high/middle gain modes with more than 2 gain steps.

7. The amplifier circuit as claimed in claim 5, wherein the low gain mode is provided by the selection of the MOSFET amplifier circuit.

8. The amplifier circuit as claimed in claim 5, wherein the middle and high gain modes are provided by the selection of the BJT amplifier circuit.

9. The amplifier circuit as claimed in claim 1, further comprising a degeneration inductor operatively coupled to the MOSFET switch circuit for providing shared matching with the real portion of input impedance between the MOSFET amplifier circuit and the BJT amplifier circuit.

10. The amplifier circuit as claimed in claim 1, wherein said external matching network provides matching with the imaginary portion of input impedance when the BJT amplifier circuit is selected.

11. The amplifier circuit as claimed in claim 1, further comprising a capacitor bank arranged for matching with the imaginary portion of input impedance when the MOSFET amplifier circuit is selected.

12. The amplifier circuit as claimed in claim 11, wherein the capacitor bank comprises one or more selectable capacitors.

13. The amplifier circuit as claimed in claim 1, wherein said LC tank for providing shared output impedance control and selective frequency response between the MOSFET amplifier circuit and the BJT amplifier circuit.

* * * * *